(12) United States Patent
Sukumaran et al.

(10) Patent No.: US 12,126,312 B1
(45) Date of Patent: Oct. 22, 2024

(54) CONTROL OF LINEAR TRANS-IMPEDANCE AMPLIFIER (TIA) DURING SETTLING AFTER RECOVERING FROM LOSS OF SIGNAL IN RECEIVER

(71) Applicant: II-VI Delaware, Inc., Wilmington, DE (US)

(72) Inventors: Dinup Sukumaran, Savoy, IL (US); Richard D. Davis, Champaign, IL (US)

(73) Assignee: II-VI Delaware, Inc., Wilmington, DE (US)

( * ) Notice: Subject to any disclaimer, the term of this patent is extended or adjusted under 35 U.S.C. 154(b) by 0 days.

(21) Appl. No.: 18/359,564

(22) Filed: Jul. 26, 2023

(51) Int. Cl.
*H03G 3/30* (2006.01)
*G01J 1/44* (2006.01)
*H03F 3/45* (2006.01)

(52) U.S. Cl.
CPC .................. *H03G 3/30* (2013.01); *G01J 1/44* (2013.01); *H03F 3/45475* (2013.01); *G01J 2001/446* (2013.01); *H03G 2201/103* (2013.01)

(58) Field of Classification Search
CPC ........ G01J 1/44; G01J 2001/446; H03G 3/30; H03G 2201/103
See application file for complete search history.

(56) References Cited

U.S. PATENT DOCUMENTS

| 11,381,318 B1 | 7/2022 | Sukumaran et al. |
| 2012/0032740 A1* | 2/2012 | Hara ..................... H03G 3/3084 330/252 |

\* cited by examiner

*Primary Examiner* — Thanh Luu
(74) *Attorney, Agent, or Firm* — The Webb Law Firm

(57) ABSTRACT

An optical device for optical signals comprises: a photodiode configured to receive the optical signals; and a linear transimpedance amplifier (TIA) having an input stage, an output stage, and at least one variable gain amplifier (VGA) provided between the input stage and the output stage. The optical device also comprises: an automatic gain control loop configured to rectify an output of the at least one VGA and compare the rectified output with a threshold gain setting to generate an automatic gain control voltage; and a detection circuitry being configured to detect a rate of change in the automatic gain control voltage and being configured to determine a first state indicative of an absence of the optical signals at the photodiode. At least in response to the determined first state, the detection circuitry is configured to disable the output stage of the linear TIA.

20 Claims, 5 Drawing Sheets

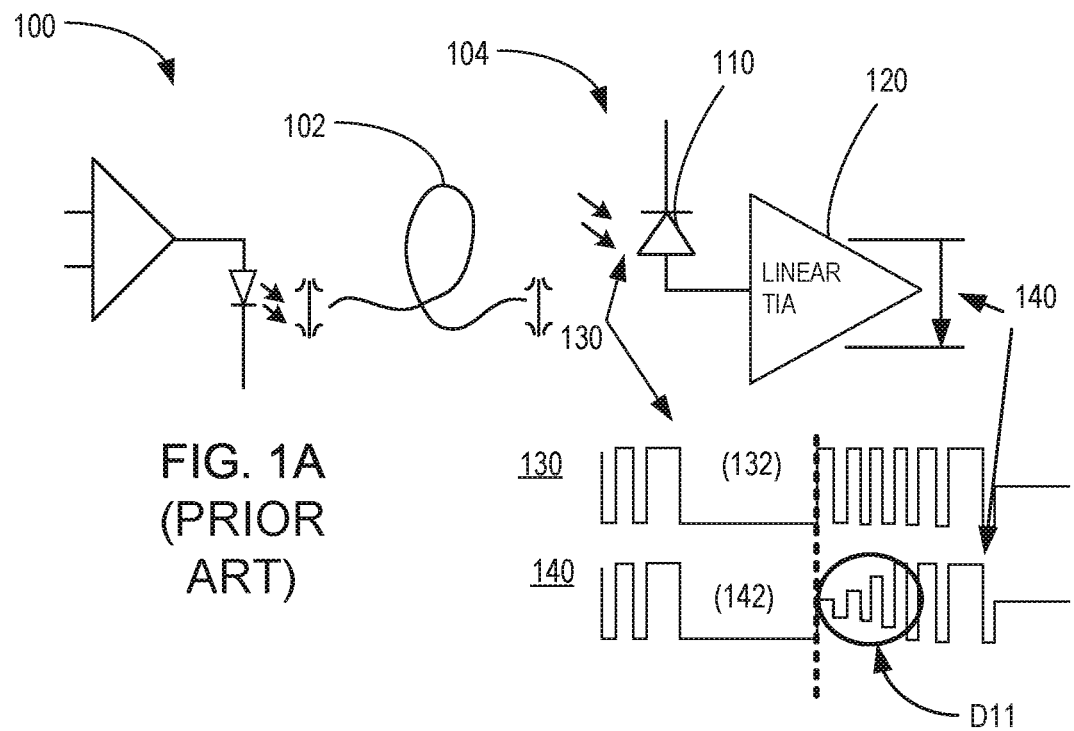
FIG. 1A (PRIOR ART)
FIG. 1B (PRIOR ART)
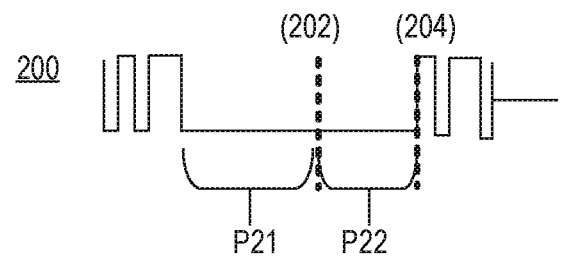
FIG. 2

CONTROL OF LINEAR TRANS-IMPEDANCE AMPLIFIER (TIA) DURING SETTLING AFTER RECOVERING FROM LOSS OF SIGNAL IN RECEIVER

BACKGROUND

1. Field

This disclosed subject matter relates generally to optical receivers and, in some non-limiting embodiments, to systems and methods for accurately detecting when a linear Trans-Impedance Amplifier (TIA) of an optical receiver has settled after a signal resumption event (e.g., after loss of signal) has occurred at the input of the linear TIA.

2. Description of Related Art

For the purposes of this disclosure, a fiber-optic cable physical interface is considered. As shown in FIG. 1A, data is transmitted over an optical fiber 102 from a laser transmitter 100 driven by a laser driver. Optical signals 130 from the optical fiber 102 are received at a receiver 104 through a combination of a photodetector 110 followed by a linear Trans-Impedance Amplifier (TIA) 120, whose output is electrical differential data 140, as illustrated in FIG. 1B.

In a data communication receiver 104, such as a small form-factor pluggable (SFP) module, one requirement is to squelch the output of the receiver 104 when a loss of input optical signal event is detected. The loss of signal may result from unplugging of the receiver, reconfiguring of the system, or other reasons. For example, FIG. 1B shows a loss of input 132 for the optical signal 130 and shows the squelch 142 of the TIA output data 140. For PAM4 data, the TIA must be linear in its amplification and called a Linear TIA. When the input optical signal 130 resumes, the receiver's TIA 120 needs time to readapt to the change in input optical power level, during which time the TIA 120 will not be operating correctly. The TIA 120 preferably does not send out invalid data while the adaptation is still on-going. Therefore, there is a desire to stop outputting the data 140 from the TIA 120 until valid data can be sent, and there is a desire to start sending valid data 140 as soon as possible from the TIA 120 once operating correctly.

Some of the existing solutions turn on the TIA's output data 140 immediately on optical signal resumption and send invalid data D11 as shown in FIG. 1B until the TIA 120 resettles to a valid operating condition. Other solutions use a fixed delay to keep the TIA's output squelched 142 to avoid sending such invalid data D11. Because the TIA's settling time depends on input optical signal levels, these fixed delays can be either smaller or larger than the actual settling time required for the TIA 120. If the delay is shorter than the actual TIA settling time, then that results in sending invalid data D11. If the delay is longer than the TIA settling time, then the response time up to the resumption of the optical signal is unnecessarily increased. Not only do existing solutions not adequately time when to resume outputting data 140 for the TIA 120, existing technologies do not have a mechanism to speed up the time in which to output valid data (140) during an optical input signal resumption event to meet the shorter settling time desired. While U.S. Pat. No. 11,381,318, entitled "Control of Trans-Impedance Amplifier (TIA) during Settling after Recovery from Loss of Signal in Receiver," which is assigned to the assignee of the present application and is hereby incorporated by reference in its entirety, discloses a system and method for accurately detecting TIA settling after a signal resumption event to avoid sending invalid data, this patent does not contemplate the particularities of such a system when utilizing a linear TIA. For example, on resumption of the input signal to the linear TIA, the automatic gain control (AGC) loop of the linear TIA takes time to settle and settling time is proportional to the input step. Until the linear TIA control loop settles down to a transient step input, the linear TIA will not be able to send out valid data. Currently there is no method to accurately sense the settling instant of the linear TIA AGC feedback loop to avoid sending invalid data The subject matter of the present disclosure is directed to overcoming, or at least reducing the effects of, one or more of the problems set forth above.

SUMMARY

Accordingly, it is an object of the presently disclosed subject matter to provide systems that overcome some or all of the deficiencies of the prior art.

According to non-limiting embodiments, provided is an optical device for optical signals. The optical device comprises: a photodiode configured to receive the optical signals; and a linear transimpedance amplifier (TIA) having an input stage, an output stage, and at least one variable gain amplifier (VGA) provided between the input stage and the output stage. The input stage is coupled to the photodiode, the output stage is coupled to the input stage and is controllable to enable and disable output of a linear TIA output. The optical device also comprises: an automatic gain control loop configured to rectify an output of the at least one VGA and compare the rectified output with a threshold gain setting to generate an automatic gain control voltage; and a detection circuitry being configured to detect a rate of change in the automatic gain control voltage and being configured to determine a first state indicative of an absence of the optical signals at the photodiode. At least in response to the determined first state, the detection circuitry is configured to disable the output stage of the linear TIA.

The detection circuitry may be configured to determine a second state indicative of a presence of the optical signals at the photodiode and, at least in response to the second state determined after the first state and in response to the detected rate of change, the detection circuitry may be configured to disable the output stage of the linear TIA. The detection circuitry may comprise a received-signal-strength indicator coupled to the photodiode and configured to indicate the first and second states of the optical signals at the photodiode. At least in response to the second state and in response to an absence of the rate of change in the feedback signal of the feedback amplifier, the detection circuitry may be configured to enable the output stage of the linear TIA. The detection circuitry may comprise a digital logic circuit configured to process logic combinations of the first state, the second state, the presence of the rate of change, and the absence of the rate of change and providing enable and disable signals to the output stage of the linear TIA based on the processed logic combinations.

The automatic gain control loop may comprise a rectifier connected to the output of the at least one VGA and threshold circuitry configured to produce the threshold gain setting. The detection circuitry may comprise a slope detection circuitry configured to detect for the rate of change in the automatic gain control voltage. In one non-limiting embodiment, the slope detection circuitry comprises: an operational amplifier; a first comparator configured to compare an output of the operational amplifier to a positive automatic gain control voltage and to provide first comparative states therefrom; a second comparator configured to compare the output of the operational amplifier to a negative automatic gain control voltage and to provide second comparative states therefrom; and an OR logic gate receiving the first and second comparative states and configured to output a signal indicating the rate of change in the automatic gain control voltage. The optical device may be an optical receiver or at least part of an optical transceiver.

According to non-limiting embodiments, provided is an optical receiver, comprising: a photodiode; a linear transimpedance amplifier (TIA) comprising an input stage, an output stage, and at least one variable gain amplifier (VGA) provided between the input stage and the output stage with the linear TIA being coupled to the photodiode; an automatic gain control loop configured to rectify an output of the at least one VGA and compare the rectified output with a threshold gain setting to generate an automatic gain control voltage signal; a slope detection circuit configured to receive the automatic gain control voltage signal and configured to monitor the automatic gain control voltage signal from the automatic gain control loop with the slope detection circuit being configured to provide, in response to a slope in the automatic gain control voltage signal being detected, a first slope-status signal indicating the slope is detected; and a logic circuit being coupled to the slope detection circuit and being coupled to the output stage of the linear TIA. The logic circuit is configured to squelch the output stage of the linear TIA in response to the first slope-status signal.

The optical receiver may further comprise a received-signal-strength indicator (RSSI) configured to provide a first indication signal asserting loss of signal (LOS) at the photodiode and a second indication signal de-asserting the LOS at the photodiode. The logic circuit may be configured to output, in response to the first indication signal asserting loss of signal (LOS), a squelch signal from the logic circuit to the output stage of the linear TIA. The logic circuit may be configured to output, in response to the second indication signal de-asserting loss of signal (LOS) and the first slope-status signal indicating the slope is detected, a squelch signal from the logic circuit to the output stage of the linear TIA. The slope detection circuit may be further configured to provide, in response to a slope in the automatic gain control voltage signal being not detected, a second slope-status signal indicating the slope is not detected to the logic circuit. The logic circuit may be configured to output, in response to the second indication signal de-asserting loss of signal (LOS) and the second slope-status signal indicating the slope is not detected, a squelch de-assert signal from the logic circuit to the output stage of the linear TIA. The output stage of the linear TIA may be activated in response to receiving the squelch de-assert signal.

The automatic gain control loop may comprise a rectifier connected to the output of the at least one VGA and threshold circuitry configured to produce the threshold gain setting. The slope detection circuit may comprise: an operational amplifier; a first comparator configured to compare an output of the operational amplifier to a positive automatic gain control voltage and to provide first comparative states therefrom; a second comparator configured to compare the output of the operational amplifier to a negative automatic gain control voltage and to provide second comparative states therefrom; and an OR logic gate receiving the first and second comparative states and configured to output a signal indicating the slope in the automatic gain control voltage.

According to non-limiting embodiments, provided is a method of controlling an output of a linear transimpedance amplifier (TIA). The method comprises: sending, in response to a first indication signal asserting loss of signal (LOS), a squelch signal to an output buffer of the linear TIA to squelch an output voltage of the linear TIA; rectifying an output of at least one variable gain amplifier VGA of the linear TIA and comparing the rectified output with a threshold gain setting to generate an automatic gain control voltage signal; monitoring the automatic gain control voltage signal to determine whether a slope is detected in the automatic gain control voltage; sending, in response to a slope in the automatic gain control voltage signal being detected, a first slope-status signal indicating the slope is detected; and sending, in response to a second indication signal de-asserting LOS and the first slope-status signal, a squelch signal to the output buffer of the linear TIA to keep squelching the output voltage of the linear TIA.

The method may further comprise: sending, in response to no slope being detected in the automatic gain control voltage signal, a second slope-status signal indicating the slope is not detected; and sending, in response to the second indication signal de-asserting LOS and the second slope-status signal, an unsquelch signal to the output buffer of the linear TIA to unsquelch the output voltage of the linear TIA. The first indication signal asserting LOS and the second indication signal asserting LOS may be provided by a received-signal-strength indicator (RSSI) at a photodiode of an optical receiver. The automatic gain control voltage signal may be monitored by a slope detection circuit to determine whether a slope is detected in the automatic gain control voltage.

Further embodiments are set forth in the following numbered clauses:

Clause 1: An optical device for optical signals, the optical device comprising: a photodiode configured to receive the optical signals; a linear transimpedance amplifier (TIA) having an input stage, an output stage, and at least one variable gain amplifier (VGA) provided between the input stage and the output stage, the input stage coupled to the photodiode, the output stage coupled to the input stage and being controllable to enable and disable output of a linear transimpedance amplifier output; an automatic gain control loop configured to rectify an output of the at least one VGA and compare the rectified output with a threshold gain setting to generate an automatic gain control voltage; and a detection circuitry being configured to detect a rate of change in the automatic gain control voltage and being configured to determine a first state indicative of an absence of the optical signals at the photodiode, wherein at least in response to the determined first state, the detection circuitry is configured to disable the output stage of the linear transimpedance amplifier.

Clause 2: The optical device of clause 1, wherein the detection circuitry is configured to determine a second state indicative of a presence of the optical signals at the photodiode; and wherein at least in response to the second state determined after the first state and in response to the detected rate of change, the detection circuitry is configured to disable the output stage of the linear TIA.

Clause 3: The optical device of clause 1 or clause 2, wherein the detection circuitry comprises a received-signal-strength indicator coupled to the photodiode and configured to indicate the first and second states of the optical signals at the photodiode.

Clause 4: The optical device of clause 1 or clause 2, wherein at least in response to the second state and in response to an absence of the rate of change in the feedback signal of the feedback amplifier, the detection circuitry is configured to enable the output stage of the linear TIA.

Clause 5: The optical device of clause 4, wherein the detection circuitry comprises a digital logic circuit configured to process logic combinations of the first state, the second state, the presence of the rate of change, and the absence of the rate of change and providing enable and disable signals to the output stage of the linear TIA based on the processed logic combinations.

Clause 6: The optical device of any of clauses 1-5, wherein the automatic gain control loop comprises a rectifier connected to the output of the at least one VGA and threshold circuitry configured to produce the threshold gain setting.

Clause 7: The optical device of any of clauses 1-6, wherein the detection circuitry comprises a slope detection circuitry configured to detect for the rate of change in the automatic gain control voltage, the slope detection circuitry comprising: an operational amplifier; a first comparator configured to compare an output of the operational amplifier to a positive automatic gain control voltage and to provide first comparative states therefrom; a second comparator configured to compare the output of the operational amplifier to a negative automatic gain control voltage and to provide second comparative states therefrom; and an OR logic gate receiving the first and second comparative states and configured to output a signal indicating the rate of change in the automatic gain control voltage.

Clause 8: The optical device of any of clauses 1-7, wherein the optical device is an optical receiver or at least part of an optical transceiver.

Clause 9: An optical receiver, comprising: a photodiode; a linear transimpedance amplifier (TIA) comprising an input stage, an output stage, and at least one variable gain amplifier (VGA) provided between the input stage and the output stage, wherein the linear TIA is coupled to the photodiode; an automatic gain control loop configured to rectify an output of the at least one VGA and compare the rectified output with a threshold gain setting to generate an automatic gain control voltage signal; a slope detection circuit configured to receive the automatic gain control voltage signal and configured to monitor the automatic gain control voltage signal from the automatic gain control loop, wherein the slope detection circuit is configured to provide, in response to a slope in the automatic gain control voltage signal being detected, a first slope-status signal indicating the slope is detected; and a logic circuit being coupled to the slope detection circuit and being coupled to the output stage of the linear TIA, the logic circuit being configured to squelch the output stage of the linear TIA in response to the first slope-status signal.

Clause 10: The optical receiver of clause 9, further comprising: a received-signal-strength indicator (RSSI) configured to provide a first indication signal asserting loss of signal (LOS) at the photodiode and a second indication signal de-asserting the LOS at the photodiode.

Clause 11: The optical receiver of clause 9 or clause 10, wherein the logic circuit is configured to output, in response to the first indication signal asserting loss of signal (LOS), a squelch signal from the logic circuit to the output stage of the linear TIA.

Clause 12: The optical receiver of any of clauses 9-11, wherein the logic circuit is configured to output, in response to the second indication signal de-asserting loss of signal (LOS) and the first slope-status signal indicating the slope is detected, a squelch signal from the logic circuit to the output stage of the linear TIA.

Clause 13: The optical receiver of any of clauses 9-11, wherein the slope detection circuit is further configured to provide, in response to a slope in the automatic gain control voltage signal being not detected, a second slope-status signal indicating the slope is not detected to the logic circuit.

Clause 14: The optical receiver of clause 13, wherein the logic circuit is configured to output, in response to the second indication signal de-asserting loss of signal (LOS) and the second slope-status signal indicating the slope is not detected, a squelch de-assert signal from the logic circuit to the output stage of the linear TIA, wherein the output stage of the linear TIA is activated in response to receiving the squelch de-assert signal.

Clause 15: The optical receiver of any of clauses 9-14, wherein the automatic gain control loop comprises a rectifier connected to the output of the at least one VGA and threshold circuitry configured to produce the threshold gain setting.

Clause 16: The optical receiver of any of clauses 9-15, wherein the slope detection circuit comprises: an operational amplifier; a first comparator configured to compare an output of the operational amplifier to a positive automatic gain control voltage and to provide first comparative states therefrom; a second comparator configured to compare the output of the operational amplifier to a negative automatic gain control voltage and to provide second comparative states therefrom; and an OR logic gate receiving the first and second comparative states and configured to output a signal indicating the slope in the automatic gain control voltage.

Clause 17: A method of controlling an output of a linear transimpedance amplifier (TIA), the method comprising: sending, in response to a first indication signal asserting loss of signal (LOS), a squelch signal to an output buffer of the linear TIA to squelch an output voltage of the linear TIA; rectifying an output of at least one variable gain amplifier VGA of the linear TIA and comparing the rectified output with a threshold gain setting to generate an automatic gain control voltage signal; monitoring the automatic gain control voltage signal to determine whether a slope is detected in the automatic gain control voltage; sending, in response to a slope in the automatic gain control voltage signal being detected, a first slope-status signal indicating the slope is detected; and sending, in response to a second indication signal de-asserting LOS and the first slope-status signal, a squelch signal to the output buffer of the linear TIA to keep squelching the output voltage of the linear TIA.

Clause 18: The method of clause 17, further comprising: sending, in response to no slope being detected in the automatic gain control voltage signal, a second slope-status signal indicating the slope is not detected; and sending, in response to the second indication signal de-asserting LOS and the second slope-status signal, an unsquelch signal to the output buffer of the linear TIA to unsquelch the output voltage of the linear TIA.

Clause 19: The method of clause 17 or clause 18, wherein the first indication signal asserting LOS and the second indication signal asserting LOS are provided by a received-signal-strength indicator (RSSI) at a photodiode of an optical receiver.

Clause 20: The method of any of clauses 17-19, wherein the automatic gain control voltage signal is monitored by a slope detection circuit to determine whether a slope is detected in the automatic gain control voltage.

These and other features and characteristics of the presently disclosed subject matter, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the disclosed subject matter. As used in the specification and the claims, the singular forms of "a," "an," and "the" include plural referents unless the context clearly dictates otherwise.

BRIEF DESCRIPTION OF THE DRAWINGS

Additional advantages and details of the disclosed subject matter are explained in greater detail below with reference to the exemplary embodiments that are illustrated in the accompanying figures, in which:

FIG. 1A illustrates a conventional optical communication system having a transmitter communicating optical signals to a receiver via an optical fiber;

FIG. 1B illustrates optical signals received at the receiver compared to invalid output signals output by the receiver due to recovering from a loss of signal (LOS) state;

FIG. 2 illustrates an example of desired output for a linear Trans-Impedance Amplifier (TIA) operated according to the present disclosure;

DESCRIPTION

Figure 3:
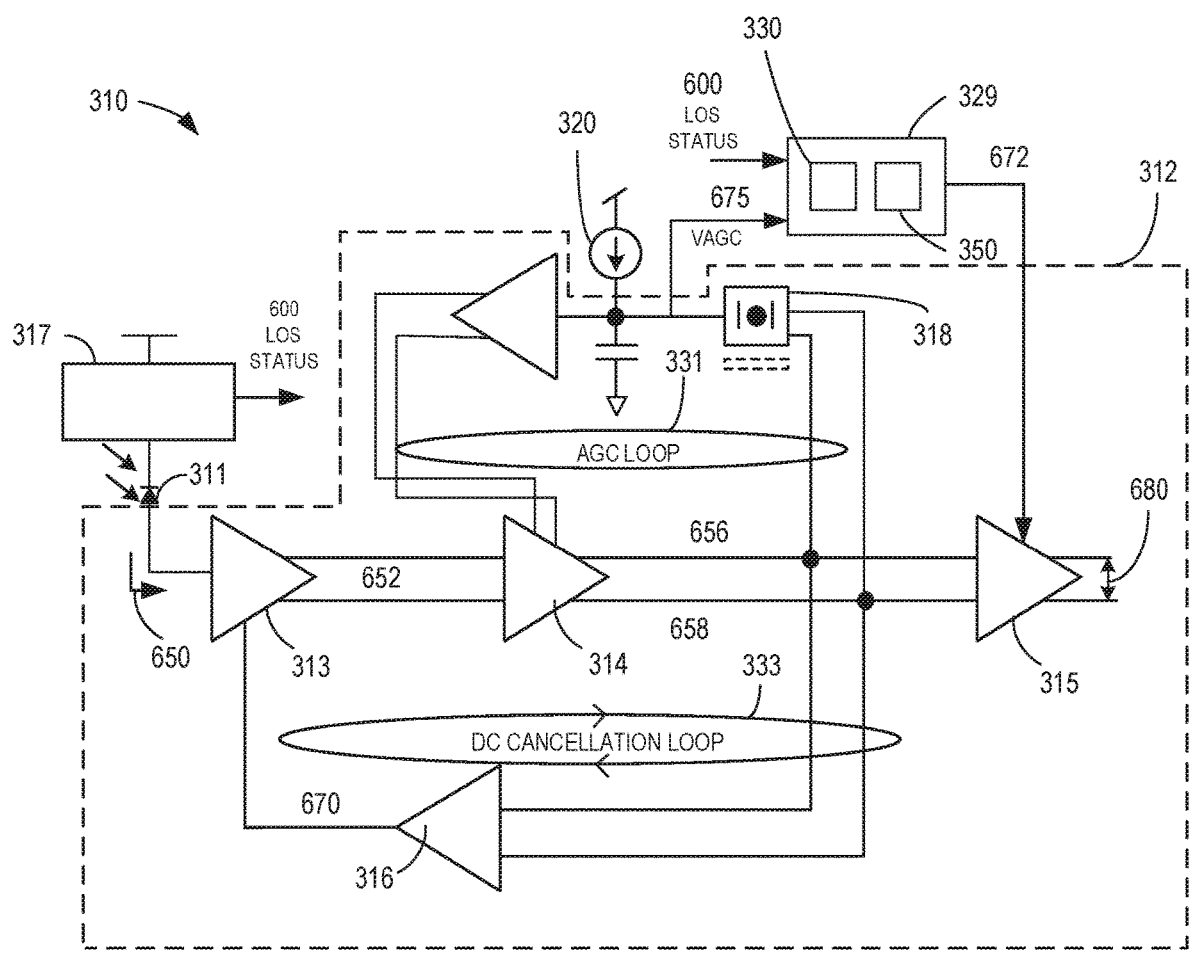
FIG. 3 illustrates a simplified block diagram of an optical receiver with a linear TIA according to the present disclosure.

For purposes of the description hereinafter, the terms "end," "upper," "lower," "right," "left," "vertical," "horizontal," "top," "bottom," "lateral," "longitudinal," and derivatives thereof shall relate to the disclosed subject matter as it is oriented in the drawing figures. However, it is to be understood that the disclosed subject matter may assume various alternative variations and step sequences, except where expressly specified to the contrary. It is also to be understood that the specific devices and processes illustrated in the attached drawings, and described in the following specification, are simply exemplary embodiments of the disclosed subject matter. Hence, specific dimensions and other physical characteristics related to the embodiments disclosed herein are not to be considered as limiting unless otherwise indicated.

No aspect, component, element, structure, act, step, function, instruction, and/or the like used herein should be construed as critical or essential unless explicitly described as such. Also, as used herein, the articles "a" and "an" are intended to include one or more items and may be used interchangeably with "one or more" and "at least one." Where only one item is intended, the term "one" or similar language is used. Also, as used herein, the terms "has," "have," "having," or the like are intended to be open-ended terms. Further, the phrase "based on" is intended to mean "based at least partially on" unless explicitly stated otherwise.

Some non-limiting embodiments are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, etc.

The present disclosure is directed to a slope detection circuit to accurately detect when a linear Trans-Impedance Amplifier (TIA) of an optical receiver has settled after a signal resumption event (e.g., after loss of signal) has occurred at the input of the linear TIA. Accurate sensing of the linear TIA's settling is used to avoid sending invalid data by squelching the output of the linear TIA until a control loop of the TIA re-adapts and settles back into a correct operating condition.

With reference to FIG. 2, an example of desired output for a linear TIA operated according to the present disclosure is illustrated. Data 200 for the linear TIA's output proceeds until there is a loss of signal detected at the receiver. When a loss of input optical signal event is detected and a LOS indication is asserted, the output of the linear TIA's data is squelched for time period P21. At point 202, the input optical signal resumes, the LOS indication is de-asserted, but the squelch of the TIA's output is not yet de-asserted because the receiver's (TIA) needs time to adapt or readapt. After point 202, there is a slope of the TIA's automatic gain control (AGC) loop voltage signal, which can be detected by the slope detection circuit described in more detail below. Accordingly, the output of the receiver is further squelched in the time period P22 until the linear TIA has adapted. Eventually, at a point 204 when adaption or settling of the linear TIA of the receiver is completed after time period P22, there is no slope of the linear TIA's AGC loop voltage signal, and the squelch of the linear TIA's output is de-asserted. Accordingly, the data 200 for the receiver's output can continue without including invalid data. By using the slope detection circuit disclosed herein, the settling instant of the linear TIA's AGC loop can be accurately sensed to avoid sending invalid data until the loop settles down; and valid data can be available at the linear TIA output promptly. In one non-limiting configuration, the time period P22 from when the input signal resumes to when the squelch of the linear TIA's output is ended can be within 80 μs of a transient step input.

Having an understanding of how a slope detection circuit of the present disclosure is intended to control the output of a linear TIA for a receiver, discussion now turns to the circuitry and other features of a receiver, and a method of controlling an output of a linear TIA for a receiver. In particular, FIG. 3 illustrates a simplified block diagram of an optical receiver 310 according to the present disclosure. The optical receiver 310 includes a photodiode 311, a received-signal-strength indicator (RSSI) 317, a linear TIA 312, a DC cancellation feedback amplifier 316, a slope-handling circuit 329, and an output buffer 315.

In general and as will be described below, the optical receiver 310 receives an optical signal at the photodiode 311, and the linear TIA 312 converts the varying input current from the photodiode (amplifying it as well) to a voltage for output as a differential output voltage 680 from the output buffer 315. In one non-limiting embodiment, the linear TIA 312 includes a low noise input stage 313 configured to amplify the signal from the photodiode 311, followed by a variable gain amplifier (VGA) stage 314 and the output buffer 315. While only a single VGA stage 314 is illustrated in FIG. 3, this is not to be construed as limiting the present disclosure as there could be multiple stages of VGAs based on the application. Based on the input signal amplitude, the VGA stage 314 increases or reduces its gain to keep the output of the TIA 312 linear. The VGA output is rectified by a rectifier 318 and compared with a threshold gain setting produced by threshold circuitry 320 to generate a control voltage ($V_{agc}$) to adjust VGA gain. In one non-limiting embodiment, the threshold circuitry 320 provides threshold current to achieve a particular VGA gain. Control voltage ($V_{agc}$) is set by the AGC loop to make current output of the rectifier equal to the threshold current.

The DC cancellation feedback amplifier 316 is used to reduce a DC component of the current of the varying input current using negative feedback. The DC cancellation feedback amplifier 316 connects to the differential outputs 656, 658 from the VGA stage 314.

Briefly, the photodiode 311 has a cathode connected to the received-signal-strength indicator (RSSI) 317 and has an anode connected to input stage 313 of the linear TIA 312. The photodiode 311 is configured to receive an input optical signal and convert the input optical signal to an electrical signal 650, whose current is proportional to the optical power. The low noise input stage 313 of the linear TIA 312 is configured to receive the electrical signal 650 from the photodiode 311 and provide an electrical signal 652 to the VGA stage 314 of the linear TIA 312. The input stage 313 connects to feedback from the DC cancellation feedback amplifier 316. Namely, a feedback signal 670 from the feedback amplifier connects to the input stage 313 to handle DC offset in the output of the VGA stage 314.

The VGA stage 314 is coupled to an output buffer 315 of the linear TIA 312 with the gain amplifier 314 providing differential outputs 656, 658 to the output buffer 315. In turn, the output buffer 315 provides a differential output voltage 680 for the receiver 310. In response to a control signal 672 (e.g., a squelch signal or an unsquelch signal), however, received at the output buffer 315 from circuitry described below, the differential output voltage 680 of the output buffer 315 can be squelched and unsquelched.

To squelch the differential output voltage 680 of the output buffer 315 in response to a loss of signal, the linear TIA 312 uses the LOS status 600. To unsquelch the differential output voltage 680 of the out buffer 315 in response to a resumption of signal, the TIA 312 uses LOS status 600 and the slope-handling circuit 329.

On the cathode-side of the photodiode 311, the received signal strength indicator (RSSI) 317 is configured to indicate the received signal strength and to provide, via an output terminal of the RSSI 317, a LOS status signal 600 indicating a loss of signal (LOS) in response to the input optical signal being lost. That is, a loss of signal (LOS) is asserted, in response to the input optical signal being lost. Accordingly, the output stage 315 is switched-off in a manner discussed below.

On resumption of the input optical signal, the LOS is de-asserted. That is, a LOS status signal 600 indicating that optical signal is not lost (i.e., non-LOS or LOS de-asserted) is generated or provided. Accordingly, the linear TIA 312 adapts or re-adapts to such change using an Automatic Gain Control (AGC) loop 331 and a DC-cancellation loop 333. The AGC loop 331 is configured to rectify an output of the VGA stage 314 and compare the rectified output with a threshold gain setting to generate an automatic gain control voltage signal 675. The linear TIA 312 takes a certain settling time to adapt or readapt. During the settling time, the output data from the linear TIA 312 is invalid.

To facilitate resumption and sending valid data from the output buffer 315, the circuitry of the optical receiver 310 (FIG. 3) comprises a slope-handling circuit 329. As schematically shown here and discussed in more detail below, the slope-handling circuit 329 includes a slope detection circuit 330 and a digital logic circuit 350. The slope-handling circuit 329 receives the LOS status signal 600 from the RSSI 317 and receives the automatic gain control voltage signal ($V_{agc}$) 675 from the automatic gain control loop. The slope detection circuit 330 may be configured to receive and monitor the automatic gain control voltage signal ($V_{agc}$) 675 from the automatic gain control loop 331.

In response to the LOS status signal 600 indicating loss of signal (LOS), the slope-handling circuit 329 provides or sends a squelch signal 672 to the output buffer 315 to squelch the differential output voltage 680. For example, the squelch signal 672 is used to disable the output buffer 315. When the LOS status signal 600 indicates that optical signal is not lost, the control signal 672 from the slope-handling circuit 329 to the output buffer 315 is determined according to whether a slope is detected in the automatic gain control voltage signal ($V_{agc}$) 675 from the automatic gain control loop 331, as discussed in more detail below.

The slope detection circuit 330 is configured to monitor the settling of the linear TIA 312 after the input optical signal resumes, as indicated by the LOS status signal 600. In some examples, the slope-handling circuit 329 switches the linear TIA's output buffer 315 "ON" after the linear TIA 312 settles down, by sending an unsquelch signal 672 (e.g., a squelch de-assert signal) to the output buffer 315. That is, in response to the linear TIA 312 settling down after a loss of signal, the slope-handling circuit 329 turns the linear TIA's output buffer 315 "ON" by sending the unsquelched signal 672 (e.g., a squelch de-assert signal) from the slope-handling circuit 329 to the output buffer 315. In certain examples, the slope-handling circuit 329 turns "OFF" (e.g., squelches) the TIA's output buffer 315 by sending a squelch signal 672 to the output buffer 315. As only schematically shown here, the signal 672 is illustrated as enabling and disabling the output buffer 315 by operating a switch for a current source 335 to the output buffer 315 (see FIG. 4).

Output from the slope detection circuit 330 is asserted, e.g., is at a high voltage level, in response to the automatic gain control loop 331 being in settling mode with a slope in automatic gain control voltage signal ($V_{agc}$) 675. Output from the slope detection circuit 330 is de-asserted, e.g., is at a low voltage level, in response to the automatic gain control loop 331 having settled down, e.g., the settling of the automatic gain control loop 331 being completed. Accordingly, the output of the slope detection circuit 330 may be used to keep the output of the linear TIA 312 squelched with the squelch signal 672 until the completion of the settling of the linear TIA's automatic gain control loop 331, thereby preventing invalid data at the differential output voltage 680 of the output buffer 315. Such accurate determination of the settling instant of the linear TIA's automatic gain control loop 331, by using the slope detection circuit 330, can prevent sending invalid data out of the optical receiver 310. Further details of this slope detection circuit 330 is discussed below with reference to FIG. 4.

Figure 4:
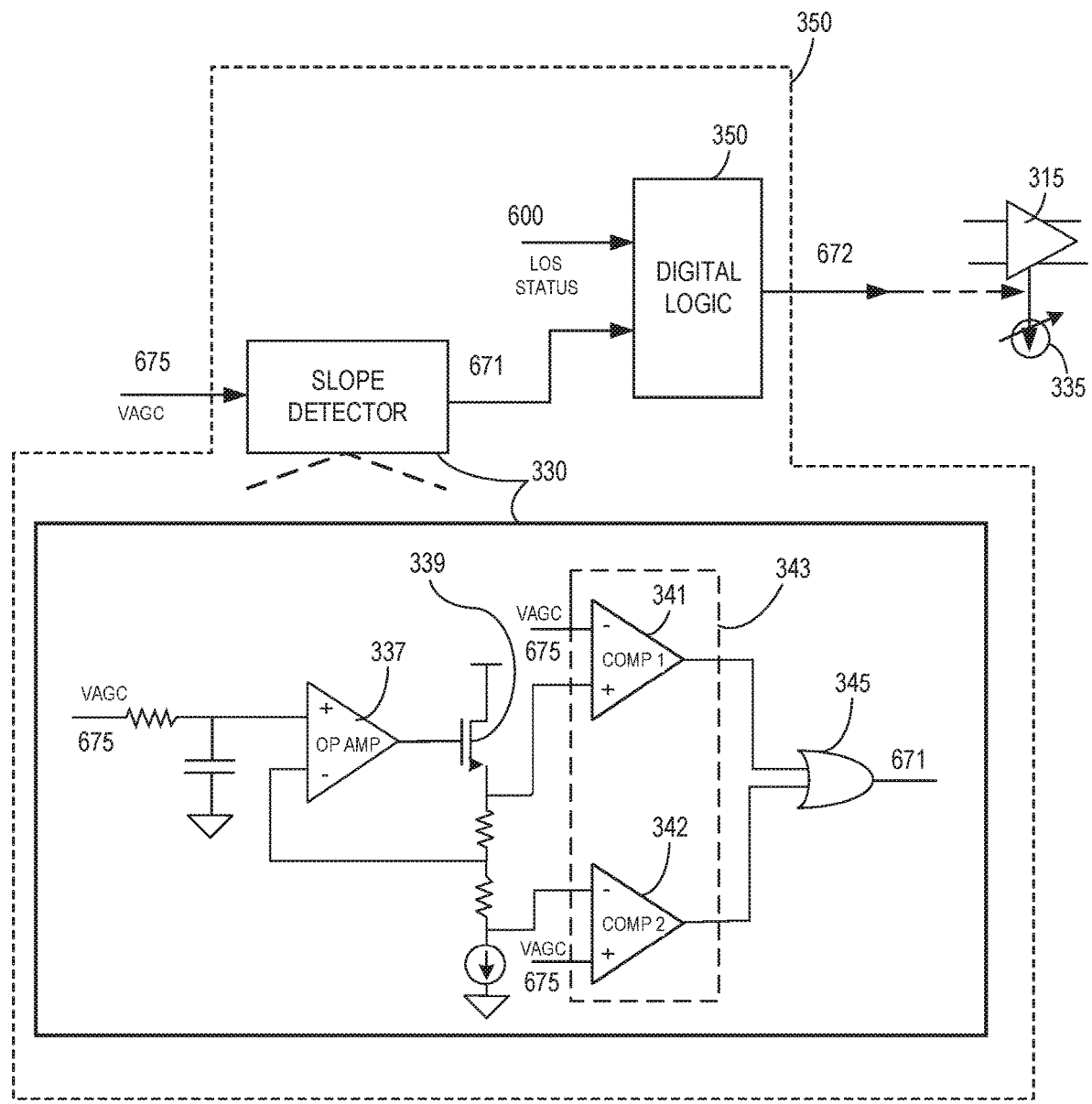
FIG. 4 shows a non-limiting embodiment of a slope detection circuit and non-limiting embodiment of a digital logic circuit.

Having an understanding of the circuitry of the receiver 310 with its slope-handling circuit 329 (slope detection circuit 330 and digital logic circuit 350) used with the linear TIA 312, discussion turns to further details of the slope detection circuit 330. With reference to FIG. 4, additional details of an example of the slope detection circuit 330 and an example of the digital logic circuit 350 for the slope handling circuit 329 are illustrated. In this configuration, the slope detection circuit 330 and the digital logic circuit 350 are configured to output squelch/unsquelch signals 672.

The slope detection circuit 330 has an input terminal that receives the automatic gain control voltage signal ($V_{agc}$) 675 and has an output terminal that outputs a slope-status signal 671. The slope detection circuit 330 is configured to receive and monitor the automatic gain control voltage signal ($V_{agc}$) 675 from the automatic gain control loop (331; FIG. 3). Processing that signal 675, the slope detection circuit 330 is configured to determine or detect whether there is a slope in the received automatic gain control voltage signal ($V_{agc}$) 675. A slope in the received automatic gain control voltage signal ($V_{agc}$) 675 indicates the signal is changing over time and has not yet settled.

The digital logic circuit 350 has a first input terminal to receive the LOS status signal 600 and has a second input terminal to receive the slope-status signal 671 from the slope detection circuit 330. The digital logic circuit 350, which can include any suitable digital logic, provides the squelch signal 672. In response to receiving the LOS status signal 600 indicating loss of signal (LOS), the digital logic circuit 350 is configured to send a squelch signal 672 to the output buffer 315. In response to the output buffer 315 receiving the squelch signal 672, the outputs of the output buffer 315 are squelched, as noted previously.

In response to a slope being detected in the automatic gain control voltage signal ($V_{agc}$) 675 by the slope detection circuit 330, the slope detection circuit 330 provides or outputs a first slope-status signal 671 (e.g., an assert signal with a predetermined voltage level) indicating that a slope in the automatic gain control voltage signal ($V_{agc}$) 675 is detected. In response to a slope NOT being detected in the automatic gain control voltage signal ($V_{agc}$) 675 by the slope detection circuit 330, the slope detection circuit 330 provides or outputs a second slope-status signal 671 (e.g., a de-assert signal with a different predetermined voltage level) indicating that a slope in the automatic gain control voltage signal ($V_{agc}$) 675 is not detected.

Accordingly, the output of the slope detection circuit 330 is coupled to the digital logic circuit 350, which is configured to receive the slope-status signal 671, which can indicate that a slope in the automatic gain control voltage signal ($V_{agc}$) 675 is or is not detected in the automatic gain control voltage signal ($V_{agc}$) 675.

In some examples, the first input terminal of the digital logic circuit 350 receives the LOS status signal 600 indicating that the optical signal is no longer lost (i.e., has resumed after being lost); and the digital logic circuit 350 is configured to, in response to receiving the first slope-status signal 671 indicating that a slope in the automatic gain control voltage signal ($V_{agc}$) 675 is detected, still send a squelch signal 672 to the output buffer 315, which then keeps the differential output voltage 680 squelched.

In another example, the first input terminal of the digital logic circuit 350 receives the LOS status signal 600 indicating that optical signal is no longer lost (i.e., has resumed after being lost); and the digital logic circuit 350 is further configured to, in response to receiving a second slope-status signal 671 indicating the slope is NOT detected in the automatic gain control voltage signal ($V_{agc}$) 675, send an unsquelch (squelch de-assert) signal 672 to the output buffer 315. Accordingly, the differential output voltage 680 of the output buffer 315 is un-squelched.

Looking at the slope detection circuit 330 in more detail, the slope detection circuit 330 is configured to receive the automatic gain control voltage signal ($V_{agc}$) 675 as an input. An operational amplifier 337 amplifies automatic gain control voltage signal ($V_{agc}$) 675 to generate an output voltage. For example, the arrangement of a resistor and a capacitor causes a time delay in voltages at a first input terminal of the operational amplifier 337 as compared to a second input terminal of the operational amplifier 337. Accordingly, when there is a slope in the automatic gain control voltage signal ($V_{agc}$) 675, a voltage difference between the input terminals of the operational amplifier 337 can represent or correspond to difference of voltages at different time points due to the slope in the automatic gain control voltage signal ($V_{agc}$) 675.

An output terminal of the operational amplifier 337 is coupled to a base of a transistor 339. The emitter of the transistor 339 is coupled to a first comparator 341 and a second comparator 342 of a window comparator 343. The first comparator 341 and the second comparator 342 have outputs connected to an OR gate 345 from which the slope-status signal 671 is available. The first comparator 341 receives, at an inverting terminal, the automatic gain control voltage signal ($V_{agc}$) 675 and, at a non-inverting terminal, the signal from the emitter of the transistor 339. The output terminal of the first comparator 341 is configured to (a) output a high voltage level, in response to non-inverting terminal of the first comparator 341 having a higher voltage than the inverting terminal of the first comparator 341; and (b) output a low voltage level, in response to the voltage of the non-inverting terminal being lower than or equal to the voltage of the inverting terminal of the first comparator 341.

For its part, the second comparator 342 receives, at a non-inverting terminal, the automatic gain control voltage signal ($V_{agc}$) 675 and, at an inverting terminal, the signal from the emitter of the transistor 339. The output terminal of the second comparator 342 is configured to (a) output a high voltage level, in response to the inverting terminal of the second comparator 342 having a lower voltage than the non-inverting terminal of the second comparator 342; and (b) output a low voltage level in response to the voltage of the inverting terminal being higher than or equal to the voltage of the non-inverting terminal of the second comparator 342.

Using the outputs from the comparators 341, 342, the OR gate 345 is configured to output a high voltage level in response to the first comparator 341 or the second comparator 342 having a high voltage level; whereas the OR gate 345 is configured to output a low voltage level, in response to both comparators 341, 342 providing a low voltage level. Although an OR gate can output a high voltage level in response to both its inputs receiving a high voltage level, the comparators 341 and 342 of FIG. 4 do not both output a high voltage level at the same time. That is, when comparator 341 outputs a high voltage level, comparator 342 can only output a low voltage level; and when comparator 341 outputs a high voltage level, comparator 342 can only output a low voltage level.

The first comparator 341 detects a positive slope to the changing of the automatic gain control voltage signal ($V_{agc}$) 675, and the second comparator 342 detects a negative slope to the changing of the automatic gain control voltage signal ($V_{agc}$) 675. In certain examples, in response to a positive slope in the automatic gain control voltage signal ($V_{agc}$) 675 received at the input terminal of the slope detection circuit 330, the output of the first comparator 341 is at a high voltage level; and the output of the OR gate 345 is at a high voltage level, as the first slope-status signal 671 indicating that a slope is detected. Thus, the slope detection circuit 330 can detect a positive slope in the automatic gain control voltage signal ($V_{agc}$) 675, and output the first slope-status signal 671 at the high voltage level to indicate the slope being detected.

In another example, in response to a negative slope in the automatic gain control voltage signal ($V_{agc}$) 675 received at the slope detection circuit 330, the output of the second comparator 342 is at a high voltage level, and the output of the OR gate 345 is at a high voltage level, as the first slope-status signal 671 indicating that a slope is detected. Thus, the slope detection circuit 330 can detect a negative slope in the changing of the automatic gain control voltage signal ($V_{agc}$) 675, and output the first slope-status signal 671 at the high voltage level to indicate the slope being detected.

In other examples, in response to no slope in the automatic gain control voltage signal ($V_{agc}$) 675 received at the input of the slope detection circuit 330, the output of the first comparator 341 is at a low voltage level; and the output of the second comparator 342 is at a low voltage level. Thus, the output of the OR gate 345 is at a low voltage level, as the second slope-status signal 671 indicating that a slope is not detected. Thus, the slope detection circuit 330 can determine there is no slope in the automatic gain control voltage signal ($V_{agc}$) 675 and can output the second slope-status signal 671 at a low voltage level to indicate there is no slope in the automatic gain control voltage signal ($V_{agc}$) 675.

As discussed previously with reference to FIG. 3, the slope detection circuit 330 and the digital circuit 350 may be coupled to the linear TIA 312. In other examples, the slope detection circuit 330 and the digital logic circuit 350 may be integrated into the linear TIA 312 or considered as portions of the linear TIA 312. For example, an integrated circuit for the linear TIA 312 can include the components of the slope detection circuit 330 and the digital logic circuit 350.

Figure 5:
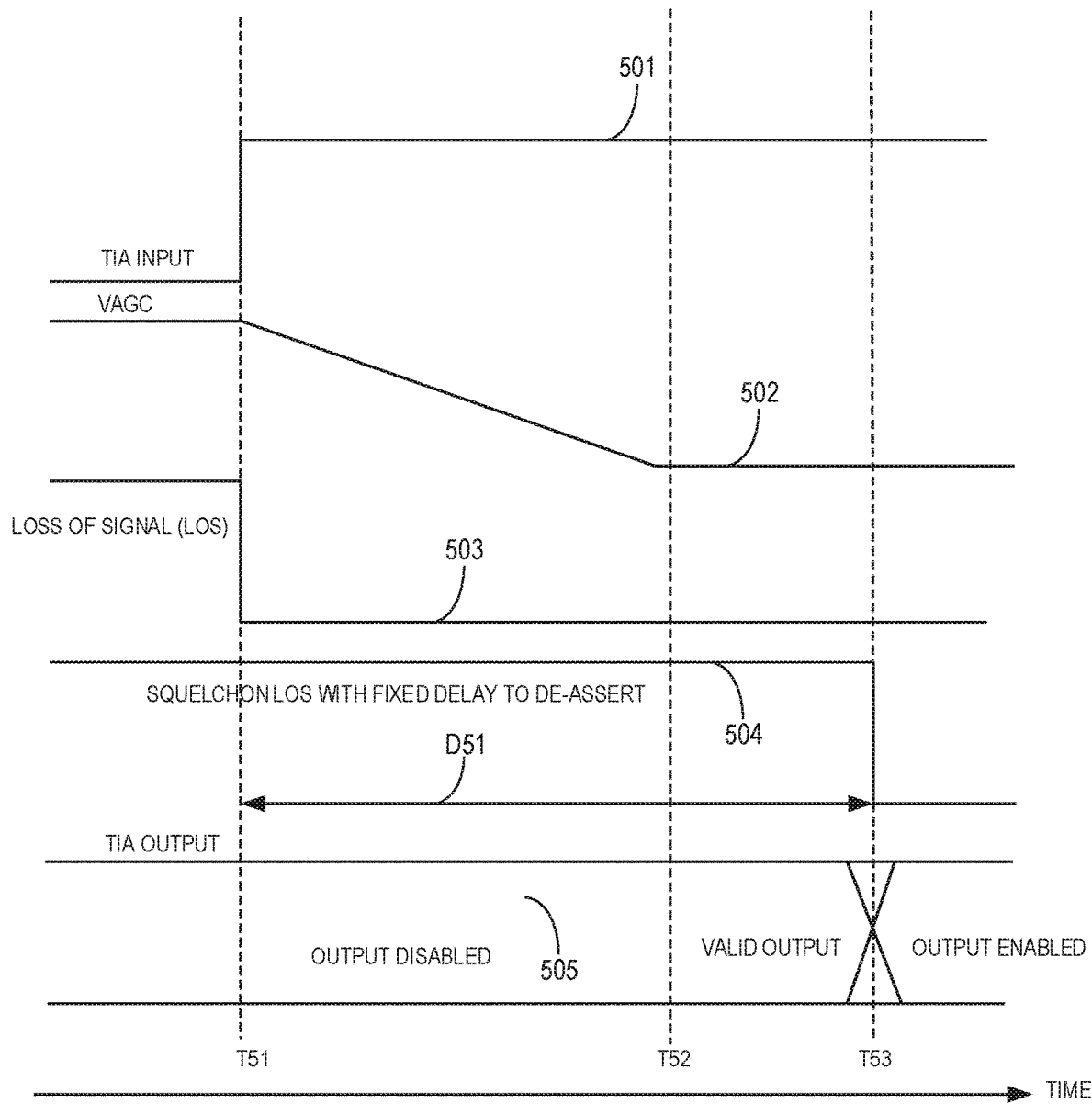
FIG. 5 shows turning "ON" of the linear TIA's output using a fixed delay from a time point of LOS de-assert.
Figure 6:
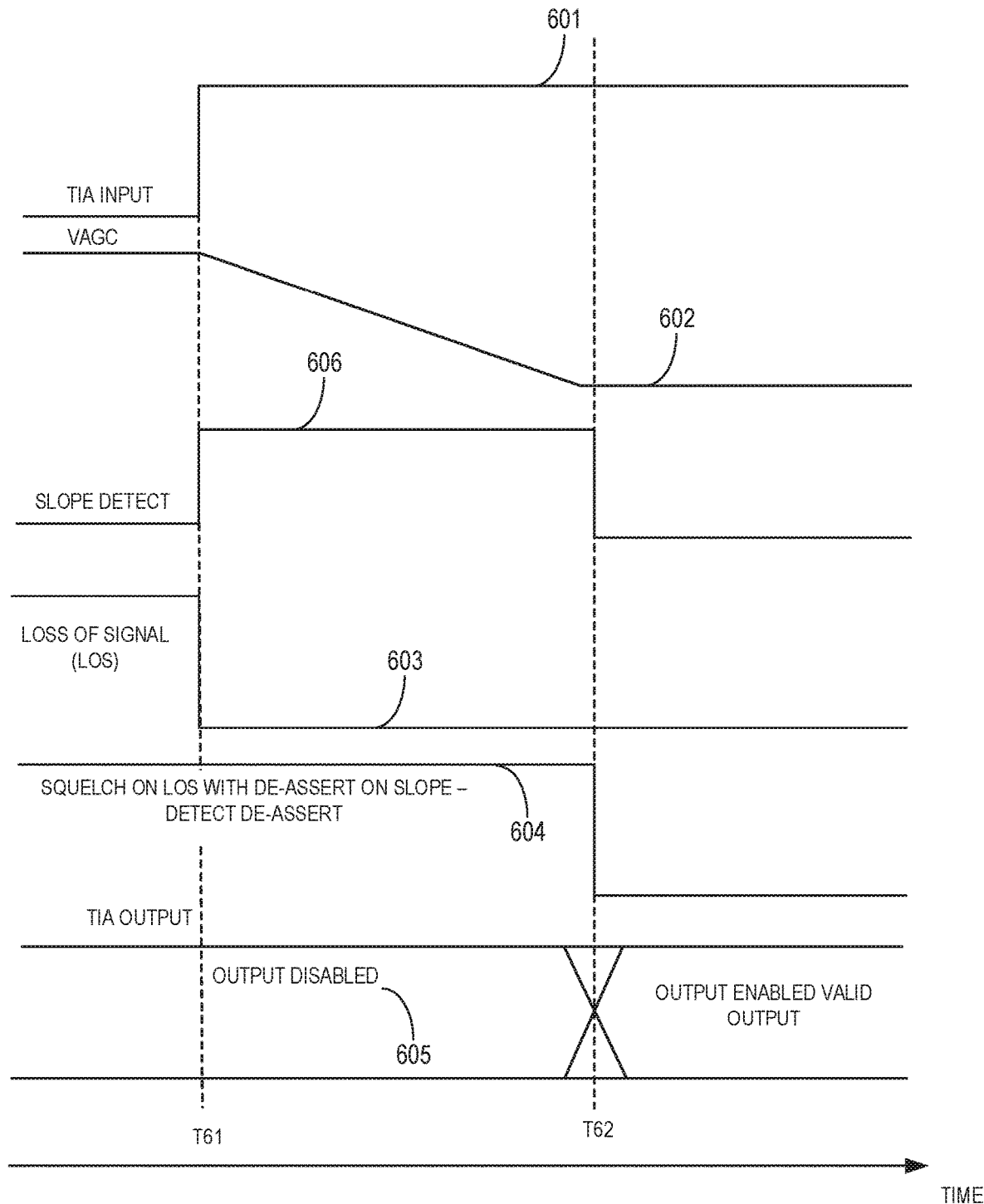
FIG. 6 shows turning "ON" of the linear TIA's output using a dynamic delay determined by a non-limiting embodiment slope detection circuit.

To illustrate the teachings of the present disclosure further, schematic examples of measurement results of the linear TIA's output un-squelching in response to an input optical step are shown in FIGS. 5 and 6. FIG. 5 graphs output of an un-squelching operation using a fixed delay according to the prior art, and FIG. 6 graphs output of an un-squelching operation using a slope detection circuit of the present disclosure.

Referring to FIG. 5, curve 501 shows TIA input voltage at different time points. The TIA input voltage 501 can be measured and is equivalent to the electrical signal 650 from the photodiode 311. Curve 502 illustrates the automatic gain control voltage signal ($V_{agc}$) 675 at different time points. The settling of the linear TIA's automatic gain control loop 331 can be interpreted from the slope in curve 502. Curve 503 illustrates the LOS status at different time points. LOS status in curve 503 switches from a LOS assert status to LOS de-assert status at time point T53.

Curve 504 illustrates a conventional squelch signal 672 sent to the output buffer 315 after a LOS assert status with a fixed delay to de-assert at time point T53 and curve 505 illustrates output of the linear TIA 312 from the output buffer 315. Curves 504 and 505 of FIG. 5 show turning "ON" of output of the linear TIA at time point T53 using a fixed delay D51 from the time point T51 when LOS status curve 503 switches from a LOS assert status to a LOS de-assert status. The settling of the linear TIA's automatic gain control loop 331 can be interpreted from the settling of the automatic gain control voltage signal ($V_{agc}$) 675 in curve 502. Between time points T51 and T52, the linear TIA (e.g., the linear TIA's automatic gain control loop) re-adapts, as indicated by the slope between T51 and T52 in curve 502. From time point T52, the linear TIA's automatic gain control loop has settled down. That is, from time point T52, the linear TIA enters into a valid operating condition. In FIG. 5, however, the linear TIA's output shown in curve 505 remains squelched between time points T52 and T53, even after the linear TIA's automatic gain control loop has settled down from T52, as can be interpreted based on curve 502. Accordingly, this fixed delay D51 produces an undesirable behavior because the linear TIA does not resume outputting data after it has already been producing valid data. Although not shown, the fixed delay D51 could equally result in the linear TIA resuming outputting data prematurely before the linear TIA's automatic gain control loop has settled down, and this would result in the linear TIA outputting invalid data.

In contrast, in FIG. 6, the TIA's output is turned "ON" using a dynamic time span (between T61 and T62) determined by a slope detection circuit consistent with the present disclosure. Referring to FIG. 6, curve 601 shows TIA input voltage at different time points. The TIA input voltage 601 can be measured and is equivalent to the electrical signal 650 from the photodiode 311. Curve 602 illustrates the automatic gain control voltage signal ($V_{agc}$) 675 at different time points. The settling of the linear TIA's automatic gain control loop 331 can be interpreted from the slope in curve 602. Curve 604 illustrates the LOS status at different time points. LOS status in curve 603 switches from a LOS assert status to LOS de-assert status at time point T61.

Curve 604 illustrates the squelch signal 672 from the slope-handling circuit 329 to the output buffer 315 and curve 605 illustrates output of the linear TIA 312 from the output buffer 315. Curve 606 illustrates the slope-status signal 671 over time. In response to a slope being detected in the automatic gain control voltage signal ($V_{agc}$) 675 by the slope detection circuit 330, the slope detection circuit 330 provides or outputs a first slope-status signal 671 (e.g., an assert signal with a predetermined voltage level) at time T61 indicating that a slope in the automatic gain control voltage signal ($V_{agc}$) 675 is detected. In response to a slope NOT being detected in the automatic gain control voltage signal ($V_{agc}$) 675 by the slope detection circuit 330, the slope detection circuit 330 provides or outputs a second slope-status signal 671 (e.g., a de-assert signal with a different predetermined voltage level) at time T62 indicating that a slope in the automatic gain control voltage signal ($V_{agc}$) 675 is not detected.

Curves 604 and 605 of FIG. 6 show turning "ON" of output of the linear TIA at time point T62 using a dynamic delay determined by the slope detection circuit, such as circuit 330 in FIG. 3. The settling of the linear TIA's automatic gain control loop 331 can be interpreted from the settling of the automatic gain control voltage signal ($V_{agc}$) 675 in curve 602. Between time points T61 and T62, the linear TIA (e.g., the linear TIA's automatic gain control loop) re-adapts, as indicated by a slope between T61 and T62 in curve 602. From time point T62, the linear TIA's automatic gain control loop has settled down. That is, from time point T62, the linear TIA enters or switches into a valid or normal operating mode. In response to the linear TIA entering into the normal operating mode, the TIA's output shown in curve 605 switches "ON" promptly, because of the use of the slope detection circuit. Accordingly, the output of the linear TIA is turned "ON" (at time point T62) as soon as the linear TIA completes adapting to the input optical signal resumption, and enters into the normal operating mode (at time point T62).

Although the disclosed subject matter has been described in detail for the purpose of illustration based on what is currently considered to be the most practical and preferred embodiments, it is to be understood that such detail is solely for that purpose and that the disclosed subject matter is not limited to the disclosed embodiments, but, on the contrary, is intended to cover modifications and equivalent arrangements that are within the spirit and scope of the appended claims. For example, it is to be understood that the presently disclosed subject matter contemplates that, to the extent possible, one or more features of any embodiment can be combined with one or more features of any other embodiment.

What is claimed is:

1. An optical device for optical signals, the optical device comprising:
   a photodiode configured to receive the optical signals;
   a linear transimpedance amplifier (TIA) having an input stage, an output stage, and at least one variable gain amplifier (VGA) provided between the input stage and the output stage, the input stage coupled to the photodiode, the output stage coupled to the input stage and being controllable to enable and disable output of a linear transimpedance amplifier output;
   an automatic gain control loop configured to rectify an output of the at least one VGA and compare the rectified output with a threshold gain setting to generate an automatic gain control voltage; and
   a detection circuitry being configured to detect a rate of change in the automatic gain control voltage and being configured to determine a first state indicative of an absence of the optical signals at the photodiode,
   wherein at least in response to the determined first state, the detection circuitry is configured to disable the output stage of the linear transimpedance amplifier.

2. The optical device of claim 1, wherein the detection circuitry is configured to determine a second state indicative of a presence of the optical signals at the photodiode; and wherein at least in response to the second state determined after the first state and in response to the detected rate of change, the detection circuitry is configured to disable the output stage of the linear TIA.

3. The optical device of claim 2, wherein the detection circuitry comprises a received-signal-strength indicator coupled to the photodiode and configured to indicate the first and second states of the optical signals at the photodiode.

4. The optical device of claim 2, wherein at least in response to the second state and in response to an absence of the rate of change in the feedback signal of the feedback amplifier, the detection circuitry is configured to enable the output stage of the linear TIA.

5. The optical device of claim 4, wherein the detection circuitry comprises a digital logic circuit configured to process logic combinations of the first state, the second state, the presence of the rate of change, and the absence of the rate of change and providing enable and disable signals to the output stage of the linear TIA based on the processed logic combinations.

6. The optical device of claim 1, wherein the automatic gain control loop comprises a rectifier connected to the output of the at least one VGA and threshold circuitry configured to produce the threshold gain setting.

7. The optical device of claim 1, wherein the detection circuitry comprises a slope detection circuitry configured to detect for the rate of change in the automatic gain control voltage, the slope detection circuitry comprising:
   an operational amplifier;
   a first comparator configured to compare an output of the operational amplifier to a positive automatic gain control voltage and to provide first comparative states therefrom;
   a second comparator configured to compare the output of the operational amplifier to a negative automatic gain control voltage and to provide second comparative states therefrom; and
   an OR logic gate receiving the first and second comparative states and configured to output a signal indicating the rate of change in the automatic gain control voltage.

8. The optical device of claim 1, wherein the optical device is an optical receiver or at least part of an optical transceiver.

9. An optical receiver, comprising:
   a photodiode;
   a linear transimpedance amplifier (TIA) comprising an input stage, an output stage, and at least one variable gain amplifier (VGA) provided between the input stage and the output stage, wherein the linear TIA is coupled to the photodiode;
   an automatic gain control loop configured to rectify an output of the at least one VGA and compare the rectified output with a threshold gain setting to generate an automatic gain control voltage signal;
   a slope detection circuit configured to receive the automatic gain control voltage signal and configured to monitor the automatic gain control voltage signal from the automatic gain control loop, wherein the slope detection circuit is configured to provide, in response to a slope in the automatic gain control voltage signal being detected, a first slope-status signal indicating the slope is detected; and
   a logic circuit being coupled to the slope detection circuit and being coupled to the output stage of the linear TIA, the logic circuit being configured to squelch the output stage of the linear TIA in response to the first slope-status signal.

10. The optical receiver of claim 9, further comprising:
    a received-signal-strength indicator (RSSI) configured to provide a first indication signal asserting loss of signal (LOS) at the photodiode and a second indication signal de-asserting the LOS at the photodiode.

11. The optical receiver of claim 10, wherein the logic circuit is configured to output, in response to the first indication signal asserting loss of signal (LOS), a squelch signal from the logic circuit to the output stage of the linear TIA.

12. The optical receiver of claim 11, wherein the logic circuit is configured to output, in response to the second indication signal de-asserting loss of signal (LOS) and the first slope-status signal indicating the slope is detected, a squelch signal from the logic circuit to the output stage of the linear TIA.

13. The optical receiver of claim 11, wherein the slope detection circuit is further configured to provide, in response to a slope in the automatic gain control voltage signal being not detected, a second slope-status signal indicating the slope is not detected to the logic circuit.

14. The optical receiver of claim 13, wherein the logic circuit is configured to output, in response to the second indication signal de-asserting loss of signal (LOS) and the second slope-status signal indicating the slope is not detected, a squelch de-assert signal from the logic circuit to the output stage of the linear TIA, wherein the output stage of the linear TIA is activated in response to receiving the squelch de-assert signal.

15. The optical receiver of claim 9, wherein the automatic gain control loop comprises a rectifier connected to the output of the at least one VGA and threshold circuitry configured to produce the threshold gain setting.

16. The optical receiver of claim 9, wherein the slope detection circuit comprises:
   an operational amplifier;
   a first comparator configured to compare an output of the operational amplifier to a positive automatic gain control voltage and to provide first comparative states therefrom;
   a second comparator configured to compare the output of the operational amplifier to a negative automatic gain control voltage and to provide second comparative states therefrom; and
   an OR logic gate receiving the first and second comparative states and configured to output a signal indicating the slope in the automatic gain control voltage.

17. A method of controlling an output of a linear transimpedance amplifier (TIA), the method comprising:
   sending, in response to a first indication signal asserting loss of signal (LOS), a squelch signal to an output buffer of the linear TIA to squelch an output voltage of the linear TIA;
   rectifying an output of at least one variable gain amplifier VGA of the linear TIA and comparing the rectified output with a threshold gain setting to generate an automatic gain control voltage signal;
   monitoring the automatic gain control voltage signal to determine whether a slope is detected in the automatic gain control voltage;
   sending, in response to a slope in the automatic gain control voltage signal being detected, a first slope-status signal indicating the slope is detected; and
   sending, in response to a second indication signal de-asserting LOS and the first slope-status signal, a squelch signal to the output buffer of the linear TIA to keep squelching the output voltage of the linear TIA.

18. The method of claim 17, further comprising:
   sending, in response to no slope being detected in the automatic gain control voltage signal, a second slope-status signal indicating the slope is not detected; and
   sending, in response to the second indication signal de-asserting LOS and the second slope-status signal, an unsquelch signal to the output buffer of the linear TIA to unsquelch the output voltage of the linear TIA.

19. The method of claim 17, wherein the first indication signal asserting LOS and the second indication signal asserting LOS are provided by a received-signal-strength indicator (RSSI) at a photodiode of an optical receiver.

20. The method of claim 17, wherein the automatic gain control voltage signal is monitored by a slope detection circuit to determine whether a slope is detected in the automatic gain control voltage.

* * * * *